United States Patent [19]

Kapp-Schwoerer et al.

[11] Patent Number: 5,236,746
[45] Date of Patent: Aug. 17, 1993

[54] CURTAIN COATING PROCESS FOR PRODUCING THIN PHOTOIMAGEABLE COATINGS

[75] Inventors: Diethard Kapp-Schwoerer, Greenwich, Conn.; David C. Siemers, Evansville, Ind.; James L. Isonhood, Henderson, Ky.; Donald E. Miller, Evansville, Ind.

[73] Assignee: Ciba-Geigy Corporation, Ardsley, N.Y.

[21] Appl. No.: 908,604

[22] Filed: Jun. 29, 1992

Related U.S. Application Data

[63] Continuation of Ser. No. 685,368, Apr. 15, 1991, abandoned.

[51] Int. Cl.⁵ ............................................. B05D 1/30
[52] U.S. Cl. ........................... 427/508; 427/510; 427/542; 427/557; 427/209; 427/294; 427/295; 427/384; 427/398.2; 427/470
[58] Field of Search ............. 427/53.1, 55, 96, 209, 427/294, 407.1, 420, 508, 510, 542, 557, 295, 384, 398.2

[56] References Cited

U.S. PATENT DOCUMENTS

| | | | |
|---|---|---|---|
| 4,230,793 | 10/1980 | Losert et al. | 427/96 |
| 4,548,837 | 10/1985 | Yoshino et al. | 427/420 |
| 4,559,896 | 12/1985 | Bessard et al. | 118/300 |
| 4,696,885 | 9/1987 | Vijan | 427/420 |
| 4,716,058 | 12/1987 | Morin | 427/420 |
| 4,791,004 | 12/1978 | Suzuki et al. | 427/55 |
| 4,847,114 | 6/1989 | Brasch et al. | 427/96 |
| 4,879,968 | 11/1989 | Menz et al. | 427/420 |
| 4,938,994 | 7/1990 | Choinski | 427/420 |

FOREIGN PATENT DOCUMENTS

| | | |
|---|---|---|
| 0002040 | 5/1979 | European Pat. Off. . |
| 0145648 | 6/1985 | European Pat. Off. . |
| 0281520 | 9/1988 | European Pat. Off. . |

OTHER PUBLICATIONS

Galvin, Electronic Packaging & Production, vol. 31, No. 6, Jun., 1991, pp. 54–56.
Dainihon Screen, Patent Abstracts of Japan, vol. 8, No. 139 (E–253) (1576) Jun. 28, 1984 Abstracting JP-A-59 048 925.
Matsuchita Eltrn Corp., World Patents Index Latest, Week 5089 AN 89-368034 Abstracting JP-A-01 276 632.
ZEV-Leiterplatten, pp. 20–24 (Nov. 1990).
Dr. N. Ivory (PC Fab) pp. 30–38 (Apr. 1990).

*Primary Examiner*—Michael Lusigan
*Assistant Examiner*—Benjamin L. Utech
*Attorney, Agent, or Firm*—Wenderoth, Lind & Ponack

[57] ABSTRACT

A process for producing thin photoresists on printed circuit boards wherein a metallic-layered substrate is conveyed beneath a free falling curtain of a photopolymerizable substance, said substance having a viscosity of 30–120 seconds DIN cup 4 @ 25° C. and being applied at a curtain height of 5–25 cm. above the board to form a coating having a dry film thickness up to about 1.5 mil after the coated surfaces are dried, whereupon the surfaces are available for photoimaging, developing, etching and stripping operations.

7 Claims, 1 Drawing Sheet

CURTAIN COATING PROCESS FOR PRODUCING THIN PHOTOIMAGEABLE COATINGS

This application is a continuation of now abandoned application, U.S. Ser. No. 07/685,368 filed Apr. 15, 1981.

BACKGROUND OF THE INVENTION

In the manufacture of printed circuit boards, a photoresist is used to transfer the outline of the circuit into the copper surface of the board. The name photoresist defines the dual functioning nature of this material. First it is a photopolymer whose chemical properties are changed by exposure to ultraviolet radiation. That exposure is done selectively through a mask outlining the circuit being defined. The dual functioning comes into play after developing the photopolymer, where the soft unwanted areas are washed off the copper surface. What remains is a protective covering of hardened polymer only in those areas outlined by the exposure mask. In one application this protective covering resists the etching process so that only the copper left unprotected is etched away. When the resist is finally removed, the protected copper circuit lines underneath become the electrical conductors of the circuit board.

One real measure of the evolution of printed circuit board technology is the width of the copper circuit lines and the spacing between them. As the component density and circuits per square inch increase, the width of the circuit lines and the spaces between them must decrease. The current state of the art is 10 mil lines with 10 mil spaces. This geometry is ultimately determined by the process technology that allows the reliable fabrication of circuit boards within tolerances acceptable to the industry. In normal production a 10 mil wide circuit line can be controlled to within plus or minus 1 mil. If this line is spaced 10 mils from an adjacent line that may also vary by only 1 mil, there is little chance of having broken lines or short circuiting between lines. If, however, that line spacing geometry is reduced to 1 mil lines and spaces, the previous tolerance is unacceptable and the process technology must be advanced to achieve and maintain a tighter tolerance.

Two methods are commonly used for applying photoresist to the copper surface of a circuit board. One of these is coating and the other is lamination. In coating, a fluid containing the photopolymer dissolved in solvent is applied to the copper surface in a thin uniform layer. The solvent is evaporated away and a uniform film of photoresist is deposited onto the copper surface. In lamination, a previously coated and dried film of photoresist on a carrier web is bonded to the copper surface using heat and pressure, after which the carrier web is stripped away.

Most of the circuit boards produced today use the dry film method for two primary reasons. First there is no solvent fluid to cause safety, personnel, environmental or disposal problems. Secondly, there is no liquid photoresist to get inside the dill-through holes to contaminate them and jeopardize the integrity of the plated through connections. These two advantages of dry film over coating are substantial but they are obtained at a price. One price is economic as dry film is about three times as costly per square foot as a coated photoresist. Additionally, dry film is a wasteful process, with the resist overhanging the board edges, for example, being totally useless. Dry film also requires the maintenance of substantial and varied inventories in order to cover the various etching and plating operations. Dry films are also susceptible to loss of resolution through overexposure and etchant leaching beneath the resist.

The other price, far more costly, is technological. Dry film has not been produced reliably below a thickness of one mil. In order to reduce the line spacing geometry so that circuit density can be significantly increased, it is necessary to reduce the thickness of the photoresist to around 0.1 to 0.2 mils.

Accordingly, as the demand for finer resolution has grown, greater consideration has been given to liquid photoimageable primary resists. The available application techniques for such liquids have also, however, exhibited certain disadvantages. Spin coating is laborious and does not allow for high volume coating. Dip coating does not assure even coating thicknesses. Roller coating is a slower process which must accommodate potential contamination of the rollers. Electrostatic spray coating involves a more complex approach with the potential for waste of the photoresist spray. Finally, electrocoating requires the application of plating technology with its greater complexity, higher cost and required close bath monitoring.

Curtain coating approaches wherein the circuit boards are conveyed beneath a curtain of photoresist have been successfully adopted for use in producing solder masks on printed circuit boards. Such a curtain coating approach and the applicable parameters have been described in U.S. Pat. No. 4,230,793. However, in view of the need to apply very thin coatings on thin inner layer core and to coat the second side of the board without damaging the first coated side, curtain coating has not been suggested for primary photoimaging. In fact, it has been suggested that only minimum deposited film thicknesses of about 50 microns can be achieved while still retaining a stable resin curtain. [see ZEV-Leiterplatten, pp. 20-24 (11/90)]. Alternatively, somewhat thinner film deposition requires rapid board transport beneath the curtain and/or substantial viscosity reduction, neither approach ensuring proper deposition and/or curtain stability.

An article by Dr. N. Ivory in PC Fab. pp. 30-38 (April 1990) also suggests the possibility of the curtain coating approach for primary imaging of circuit boards. This discussion, however, makes reference to the above noted undesirable viscosity reduction and increased substrate feed rate in order to utilize such a technique. Two additional problems are identified. Thus, difficulties are noted in coating thin innerlayer laminates due to bending and buckling phenomena. Carrier frames are therefore required in such circumstances. Protection from etchant attack of the plated through holes in double-sided and multilayer boards is also a problem whose solution requires costly additional processing.

SUMMARY OF THE INVENTION

It has now been surprisingly discovered that by selection of identified process variables, a curtain coating process can be readily and efficiently utilized for the primary imaging of printed circuit boards. Identification of appropriate lacquer viscosities, curtain height and board speed beneath the curtain combined with maintenance of the board on the conveyance means in a flat, fixed position as it passes beneath the curtain substantially eliminate the prior art difficulties while also eliminating the need for extraneous equipment such as the carrier frame and extraneous operations such as the hole protection. More specifically, the process allows for the deposition of the requisite thin films (less than about 1.5 mil dry thickness) for the primary imaging operation. Excellent adhesion on the copper substrate; greater flexibility in the operating conditions, i.e. variation available to meet specific circumstances; high resolution capabilities at 3-5 mil lines and spaces and perhaps even finer lines and spaces; straight, well-defined side walls after development; good chemical resistance of the coating in cupric chloride and ammoniacal etching systems; are all benefits achieved with the instant process.

According to the invention, a liquid substance is applied as a flowing curtain to a metallic-coated substrate conveyed in a fixed position through the curtain, said liquid substance having a viscosity of 30-120 seconds DIN cup 4 at 25° C. and being applied at a curtain height of from 5-25 cm above the substrate, the coated substrate is conveyed to a drying zone to form a coating having a maximum dry film thickness of 1.5 mil, and the process is repeated to coat the second side of the substrate.

BRIEF DESCRIPTION OF THE DRAWINGS

Preferred embodiments and other features of the invention will now be described in greater detail with reference to the accompanying drawings wherein.

DETAILED DESCRIPTION OF THE INVENTION

Figure 1:
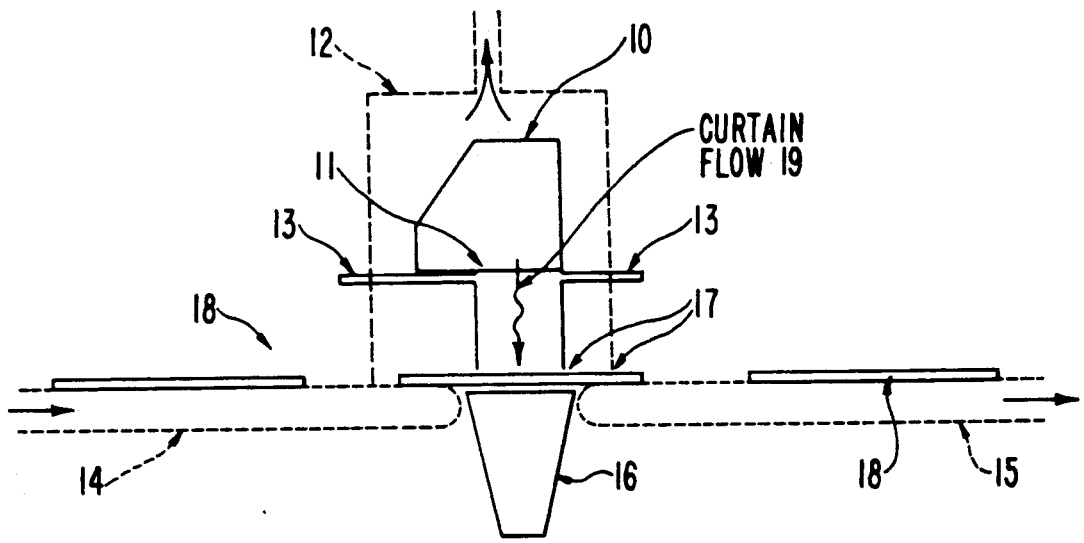
FIG. 1 is a schematic view of a coating apparatus for performing the process in accordance with the invention.

The coating machine shown in FIG. 1 comprises a coating head tank 10 in which there is a coating slot 11, an exhaust hood 12 for vapor control, inlet 13 for introduction of inert gas such as nitrogen when operating under such an atmosphere, conveyor belts 14 and 15, trough 16 and gap 17, i.e. the distance between enclosed coating head 10 and the substrates passing thereunder. Delivery lines, pumps and the belt driving means are not shown.

The substrates 18 are moved by conveyor belts 14 and 15 below tank 10. A coating resin composition issuing from slot 11 drops in the form of a substantially free falling curtain 19 onto substrates 18 and forms a thin coating ($\leq 1.5$ mil dry) thereon. The viscosity, curtain height and rate of conveyance can be related to one another, as discussed hereinafter, to produce an ideal photoimageable coating.

Figure 2:
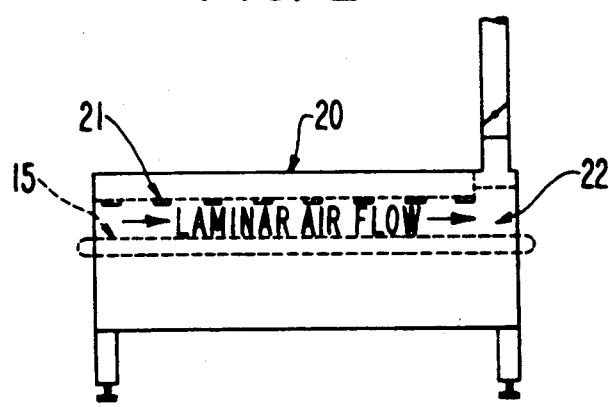
FIG. 2 is a schematic view of an accompanying drying oven.

The representative drying oven 20 depicted in FIG. 2 comprises continuing conveyor belt 15, heating elements 21 such as infrared rods and area 22 which allows for laminar air flow over the coated substrates and for stabilization of the heat profile.

In order to insure that the boards are transferred through the curtain without significant movement or slippage, belts 14 and 15 are provided with means for fixedly transporting the boards. Vacuum means are preferably utilized wherein belts 14 and 15 are perforated and vacuum is applied therethrough to maintain the board. The fixed arrangement also insures that each board reaches the same acceleration speed, thereby providing for coating uniformity and repeatability. Other means such, for example, as traction devices or the use of belts composed of acrylonitrile/butadiene rubber, antistatic polytetrafluoroethylene, and the like, which grip the boards in transit, provide the same desired effect.

It is also preferable that trough 16 exhibits a slim design such that the space between conveyor belts 14 and 15 is minimized, i.e. preferably between 5 to 12 cm and most preferably about 9.0 cm. The limited gap further insures a smooth transition through the curtain. The thin trough design also provides for a more stable lower portion of the curtain and for reduced air entrapment in the recycled resist.

In terms of applicable process parameters, the appropriate relationship between lacquer viscosity, curtain height and belt speed allows for the ready application of uniform thin films of from about 0.2-1.5 mil dry thickness; preferably 0.4-1.0 mil, and most preferably 0.60 mil for the instant photoimageable application. Lacquer viscosities range from about 30-120 sec. DIN cup 4 @ 25° C., preferably 45-70 sec., and most preferably 60 sec. DIN cup for viscosity readings are standardized procedures which verify the viscosity of a liquid in terms of the time necessary to empty a standardized cup through a standardized hole in the bottom thereof through which the liquid exits the cup. Equivalent values in mPa's units are 104-608 for the broadest range, 188-328 for the preferred range and 272 for the most preferred value. Curtain heights vary from about 5-25 cm and are preferably 14 cm. Belt acceleration speeds range from 60-125 m/min, preferably 75-110 m/min and most preferably 90 m/min. It is to be noted that the construction of the unit eliminates the criticality of careful monitoring of the gap opening to achieve appropriate coating thickness.

The substrates to be coated are known to those skilled in the art and generally consist of epoxy resin or bismaleimide resin/fiber impregnated laminate constructions. The most prevalent core consists of a copper metal layer adhered to each side of an epoxy/glass base having a 5 mil thickness. The board dimensions may vary, with modification of the process parameters as required.

A wide variety of lacquer systems may be utilized in the instant process. Such systems will generally comprise a photopolymerizable resin component, a solvent or diluent, a photoinitiator activatable by actinic radiation and fillers, crosslinking agents, and the like, as needed. Typical resins include photosensitive epoxide resins having free curable epoxide groups. The photosensitive group is preferably an ethylenically unsaturated group such as an acrylic or methacrylic group. Such resins are disclosed, for example, in U.S. Pat. Nos. 3,989,610, 4,064,287, 4,108,803, 4,413,052, 4,390,615, among others, with these patents being fully incorporated herein. The epoxide resin can be based on bisphenols, novolacs, hydantoins, uracils and isocyanurates.

Photopolymerization initiators are also known to those skilled in the art and include benzoin ethers, anthraquinone derivatives, onium salts and metallocene complexes. Typical solvents include carboxylic acid esters of lower alcohols, dialkyl ethers, ketones and preferably hydroxyalkyl ethers. Additional photopolymerizable materials may also be present such as esters of alcohols with ethylenically unsaturated carboxylic acids. The coating composition can contain further customary additives such as fillers, dyes, pigments, levelling agents, flame retardants, photosensitizers, curing agents and curing accelerators. Solids content of the lacquer will generally range from 30 to 100%, by weight, and preferably 40% by weight.

Optional steps which may be conducted prior to lacquer application include precleaning of the inner layer core and filtration of the liquid photoresist. Precleaning may be conducted by physical means as by pumice scrubbing or by chemical approaches. Such cleaning eliminates contaminants and increases the degree of adhesion of the photoresist to the copper surface. Correspondingly, filtration of the liquid photoresist prior to introduction into the coater head minimizes the adverse impact of dust and gel particles during the residence period of the liquid in the coater.

For purposes of the instant invention, infrared heating has proven to provide a superior method of drying the thin coating in a fast and efficient manner. The infrared heat combined with modest airflow insures sufficient air movement over the coated boards and stabilizes the heat profile. It is furthered preferred that the belt utilized in the drying zone ride on a cooled metal plate to insure a low temperature on the bottom surface of the board, i.e. the surface in contact with the belt. This factor is of particular value during second side coating and drying in order to protect the first coated side which rides face down on the conveyor plate. Typical drying temperatures range from 80° to 150° C. and typical conveyor speeds from 4.0 to 9.0 m/min. Current output, the length of the heating zone and the number of infrared rods will be selected on the basis of the oven type, the other process variables and maximum productivity. Current output will generally be greater for first side drying.

The imaging, developing, etching and stripping operations applicable to the coated boards are well known to those skilled in the art. Although negative resist technology is most applicable to such primary imaging, positive resists may be used. The latter are, however, particularly applicable for other coating applications. Negative resists function by photopolymerizing the areas of resist which will define the circuit during etching. The pattern is thus less soluble in the developer solution than the surrounding unexposed resist. Correspondingly, positive resists rely on a polymer which is rendered soluble in the appropriate developer upon exposure such that the unexposed areas of the resist define the circuit. In either approach, the polymer is stripped after etching.

In both the photopolymerizing and the subsequent photocrosslinking stage of the process of this invention actinic radiation of wavelength 200-600 nm is preferably used. Suitable sources of actinic radiation include carbon arcs, mercury vapour arcs, fluorescent lamps with phosphors emitting ultraviolet light, argon and xenon glow lamps, tungsten lamps, and photographic flood lamps. Of these, mercury vapour arcs, particularly sun lamps, fluorescent sun lamps, and metal halide lamps are most suitable. The times required for the exposures of the photopolymerizable composition and the still photocrosslinkable composition will depend upon a variety of factors which include, for example, the individual compounds used, the type of light source, and the distance of that source from the irradiated composition. Suitable times may be readily determined by those familiar with photopolymerization techniques. Optimum exposure energy ranges from 330 to 450 mJ/cm$^2$, with the optimum exposure times ranging from 5 to 20 seconds.

For the primary negative resists, the unexposed non-image areas may be removed by the use of aqueous alkaline solutions. Typical alkaline components include sodium and potassium carbonate, triethanolamine, monoethanolamine, anhydrous sodium sulfite, imidazolines, and the like.

Metal may be etched to form the printed circuit by means of etching fluids such as cupric chloride, ferric chloride and ammoniacal fluids such as ammonium persulfate solutions. After etching, the resist can be removed, i.e. stripped, with caustic solutions based, for example, on monoethanolamine or sodium hydroxide.

As previously noted, the curtain coating process of the invention provides a significant number of distinct advantages. In summary, it allows for the application of thin, uniform coatings necessary for primary imaging, for the use of thin inner layer core material and for excellent resolution in the imaged patterns to perhaps as small as 1 mil lines and spaces.

Although the primary focus of this descriptive material has been placed on coatings for primary imaging applications, it is to be noted that the process is equally applicable to printing plate, photochemical machining, photolithography applications, and the like. It is also to be noted that the process is applicable to liquid laser imageable photoresist technology wherein direct printing on the coating is achieved by means of laser techniques.

By way of a specific illustration of the process of the invention, a pre-filtered, epoxy/acrylate lacquer composition in propylene glycol methyl ether acetate solvent to a solids content of 40%, by weight, and having a viscosity of 60 seconds DIN cup 4 @ 25° C. is introduced into the coating unit depicted in FIG. 1. The substrate is a pumice cleaned, 45 cm ×60 cm ×5 mil thick core of copper metal on epoxy glass with the 60 cm edge being the leading edge in terms of entering the curtain. The curtain height is 14 cm above the belts which are constructed to include a vacuum hold-down mechanism and which are set to run at 90 m/min. Seventeen boards are thus coated to provide a coating thickness thereon of 0.6 mil (dry film).

The coated boards are transported into the drying zone on a conveyor belt composed of antistatic polytetrafluoroethylene over a cool metal plate, the drying zone having a infrared region of 2.1 meters featuring 18 infrared rods. The conveyor speed is set at 1.5 m/min with the constant current output for the infrared rods being 15 amperes. When the coating procedure is repeated on the second side of the board and the boards are returned to the drying zone, the current output for the infrared rods is 7.5 amperes. Boards with superior, uniform coatings are obtained.

The boards are then exposed through a high density art work having 5 mil lines and spaces utilizing mercury lamps having their major wavelength peak between 330-390 nm, with exposure energy at 150 mJ/cm$^2$. The boards are developed utilizing an aqueous potassium carbonate solution, etched with cupric chloride and then stripped utilizing a 15 %, by weight, caustic solution.

Panel yield for the 17 boards and 34 images is 100%, i.e. each board exhibits defect free surfaces. Investigation of the etched surfaces reveals well defined, consistent 5 mil lines and spaces with exceptionally straight side walls in the etched indentations.

Summarizing, it is seen that this invention provides a novel curtain coating process for use in the primary imaging of printed circuit boards. Variations may be made in procedures and materials without departing from the scope of the invention as defined by the following claims.

What is claimed is:

1. A process for producing a photoimageable coating on a metallic-covered substrate comprising the steps of (a) producing a free-falling curtain of a photopolymerizable liquid having a viscosity of 30–120 seconds DIN cup 4 at 25° C. and a height of 5–25 cm, (b) conveying said substrate on a flat perforated conveyor belt beneath said free falling curtain at a speed of about 60–120 m/min to obtain a coating of said photopolymerizable liquid on said substrate, (c) applying a vacuum through the perforations of the conveyor belt in order to firmly retain said substrate on said conveyor belt while being conveyed beneath said free falling curtain, (d) conveying the coated substrate on a flat conveyor belt composed of antistatic polytetrafluoroethylene over a cooled metal plate, said conveyor belt and said coated metal plate being in intimate contact with each other through a drying zone and (e) subjecting the coated substrate to infrared heating from above the conveyor belt and simultaneously cooling said substrate by means of said cooled metal plate, thus producing said photoimageable coating on said substrate, said coating having an overall dry film thickness of up to 1.5 mil maximum.

2. The process of claim 1, wherein said metallic-covered substrate contains a sheet of copper metal on each side thereof.

3. The process of claim 1, wherein said photopolymerizable liquid contains an epoxide resin having free curable epoxide groups and ethylenically unsaturated groups.

4. The process of claim 1, wherein said viscosity ranges from 45–70 seconds DIN cup 4 at 25°C.

5. The process of claim 1, wherein the speed at which said substrate is conveyed beneath said curtain is 75–110 m/min.

6. The process of claim 1, wherein said photopolymerizable liquid is filtered before application to the substrate.

7. The process of claim 1, wherein said photopolymerizable liquid coating is applied to achieve a dry film thickness of about 0.2–1.5 mil.

* * * * *